Feb. 6, 1962 G. R. CARROLL 3,020,493
FREQUENCY MODULATION CIRCUIT
Filed Feb. 27, 1959
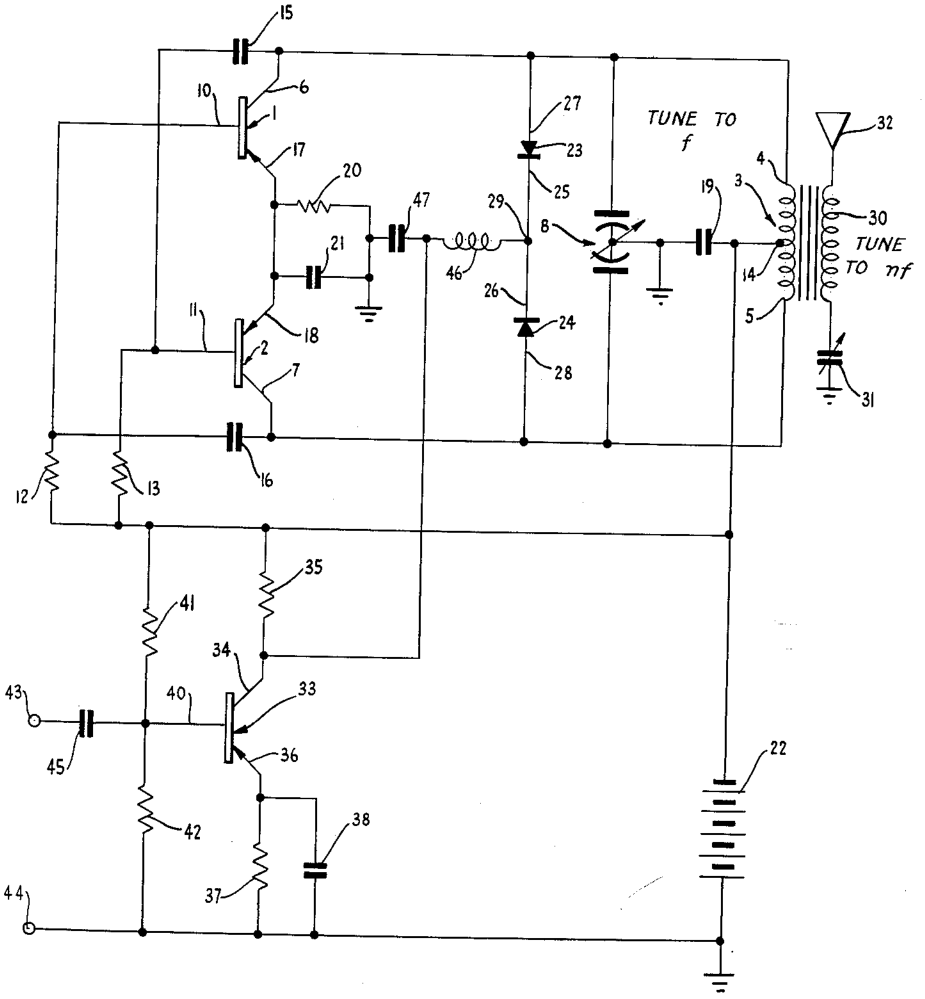
INVENTOR,
GEORGE R. CARROLL
BY Noel B. Hammond
AGENT 3,020,493

FREQUENCY MODULATION CIRCUIT

George R. Carroll, Los Angeles, Calif., assignor to Hughes Aircraft Company, Culver City, Calif., a corporation of Delaware Filed Feb. 27, 1959, Ser. No. 796,037

4 Claims. (Cl. 332—16)

This invention relates to circuit arrangements for modulating the frequency of a carrier wave and particularly to a simple circuit arrangement utilizing solid-state devices for efficiently and linearly modulating a carrier wave.

Heretofore, transistor oscillators have been frequency-modulated either by modulating the collector voltage or the base bias. Such an arrangement inherently produces non-linear modulation and develops amplitude modulation necessitating the use of amplitude limiting stages. Additionally, such arrangements provide only a small frequency deviation necessitating the use of frequency-multiplier stages to increase the frequency deviation ratio to the required amount.

Accordingly, it is an object of the present invention to provide a circuit for modulating the frequency of a wave, which circuit is simple, efficient and inexpensive.

Another object of the invention is the provision of a frequency-modulating circuit which is inherently linear and which inherently suppresses amplitude modulation.

Yet another object of the invention is to provide an improved circuit utilizing solid-state devices for modulating the frequency of a wave over a large frequency range.

A further object of the present invention is the provision of a frequency-modulation circuit utilizing solid-state devices which does not require the use of an amplitude limiter or frequency-multiplier stage.

In accordance with these and other objects of the invention, a transistor oscillator for developing a carrier wave is connected in a push-pull arrangement and includes a resonant circuit for determining the center frequency of the wave. A pair of silicon diodes whose capacitance varies in accordance with applied potential in the non-conducting direction is connected in series opposition and across the resonant circuit. A varying direct current modulation signal is applied across the diodes with a polarity such as to bias the diodes to be non-conductive, thereby causing variation in the capacitance of the resonant circuit and consequent modulation of the frequency of the carrier wave by the modulation signal. An output resonant circuit is coupled to the oscillator resonant circuit and is tuned to the third harmonic of the frequency-modulated carrier wave. To this output resonant circuit may be coupled an antenna system.

The simple, efficient and inexpensive circuit arrangement described produces a linearly frequency-modulated signal, amplitude modulation being inherently suppressed by the symmetrical arrangement. Thus, no amplitude-limiting circuit is necessary. The symmetrical arrangement also results in good even harmonic attenuation and third harmonic generation, thus affording excellent isolation between the frequency-determining circuit and the output resonant circuit. The arrangement provides a frequency-modulation signal having a large frequency deviation making unnecessary the use of frequency-multiplier circuits to increase the frequency deviation ratio.

The following specification and the accompanying drawing describe and illustrate an exemplification of the present invention. Consideration of the specification and drawing will lead to an understanding of the invention, including the novel features and objects thereof.

The single FIGURE of the drawing is a schematic diagram of a frequency-modulation circuit arranged in accordance with the present invention.

First and second transistors 1 and 2 are arranged in a symmetrical push-pull oscillator circuit for developing a carrier wave. The first and second transistors 1 and 2 should be of a type suitable for use at the oscillator frequency contemplated. In the embodiment of the invention here described, the oscillator center frequency was chosen to be 33 megacycles and the RCA 2N147 transistor has been found to be satisfactory. Although this particular transistor is of the PNP type, it will be obvious that other types may also be employed by suitable reversal of connections.

An inductor 3 has its outer ends 4 and 5 connected to the collector electrodes 6 and 7 of the two transistors 1 and 2, respectively. A butterfly or balanced dual split-stator tuning capacitor 8 has its two stators individually connected to the outer ends 4 and 5 of the inductor 3 to form a resonant circuit, while the common rotor is grounded. By means of the tuning capacitor 8, the center frequency of the oscillator may be selected or adjusted. The base electrodes 10 and 11 of the transistors 1 and 2, respectively, are each connected through individual base resistors 12 and 13 to a center tap 14 on the inductor 3.

The collector electrode 6 of the first transistor 1 is connected through a coupling capacitor 15 to the base electrode 11 of the second transistor 2 and, similarly, the collector electrode 7 of the second transistor 2 is connected to the base electrode 10 of the first transistor 1 by means of a coupling capacitor 16. The emitter electrodes 17 and 18 of the first and second transistors 1 and 2 are connected to each other. A common emitter resistor 20 is connected from the junction of the two emitter electrodes 17 and 18 to ground and is by-passed by a capacitor 21.

A center tap 14 on the inductor 3 is connected to a source of operating potential being, in the present example, the negative terminal of a battery 22. The positive terminal of the battery 22 is grounded. Radio-frequency energy at the center tap 14 of the inductor 3 is by-passed to ground by a capacitor 19.

The frequency-modulation elements are a pair of silicon diodes 23 and 24 connected in series across the inductor 3. These diodes 23 and 24 exhibit a linear capacitance change in proportion to the potential across them, when biased in the reverse or non-conducting direction. The Hughes type SA2 silicon diode has been found to be satisfactory in this application as it has a capacitance in the linear range from 15 to 25 mmfd. The diodes 23 and 24 are connected with opposite polarity and, in the exemplary embodiment described, the cathode electrodes 25 and 26 are connected together at a junction 29 while the anode electrodes 27 and 28 are connected to the outer terminals 4 and 5 of the inductor 3. By applying a varying positive potential to the junction 29 of the two diodes 23 and 24 with respect to the inductor 3, the capacitance of the oscillator frequency-determining circuit will be varied, thereby varying the frequency of the wave developed by the oscillator from the center frequency.

The symmetrical push-pull arrangement described inherently provides a low capacitance in parallel with the inductor 3 due to the fact that the effective collector capacitance of the transistors 1 and 2 and the effective capacitance of the diodes 23 and 24 is halved. Accordingly, the oscillator may be tuned efficiently to high frequencies. Further, by virtue of the symmetrical arrangement any amplitude modulation produced is suppressed, thereby eliminating the need for an amplitude limiting circuit. Because of the series arrangement, the diodes 23 and 24 provide a large linear change in capacitance with applied voltage, despite the fact that the actual value of capacitance is halved, thereby providing a large frequency deviation of the wave developed by the oscillator. Thus, the need for frequency-multiplier stages to increase the frequency deviation ratio is eliminated. Due to the connection of the diodes 23 and 24 in series opposing, there is no rectification of either half cycle of the radio-frequency signal.

An output tuned circuit comprising an inductor 30 in series with a capacitor 31 is inductively coupled to the oscillator inductor 3. Inductor 30 and capacitor 31 are tuned to the third harmonic of the center frequency of the wave developed by the oscillator, 99 megacycles in this example. It will be understood that the frequency response of the output resonant circuit is adjusted to be sufficiently broad to accommodate the frequency deviation produced by the modulation diodes 23 and 24, which in the present exemplification is plus and minus 50 kilocycles from the center frequency of 99 megacycles. The push-pull oscillator arrangement provides second harmonic attenuation and third harmonic generation, thereby giving excellent isolation between the output tuned circuit and the oscillator frequency determining circuit. By tuning the output tuned circuit to the third harmonic the need for frequency-multiplier stages to increase the frequency deviation ratio is eliminated. An antenna 32 is connected to the upper end of the output inductor 30, while the lower end of the output capacitor 31 is connected to ground. If desired, the signal could be amplified to a high power level before it is applied to the antenna 32.

A transistor modulator circuit is provided to amplify the modulating signal and to change it to a varying direct current signal having the proper polarity before it is applied to the modulation diodes 23 and 24. The amplifying element is a third transistor 33 which is also shown as being of the PNP variety. The RCA 2N147 is satisfactory for this application also, although such a high-performance transistor is not necessary. The collector electrode 34 is connected through a resistor 35 to the negative terminal of the battery 22 and the emitter electrode 36 is connected through a resistor 37 to ground. The emitter resistor 37 is by-passed by a capacitor 38. The base electrode 40 also is connected through a resistor 41 to the negative terminal of the battery 22 and through a resistor 42 to ground. Thus, the resistors 41 and 42 form a voltage divider across the battery 22.

The modulating signal is applied at a pair of terminals 43 and 44. Terminal 43 is connected through a coupling capacitor 45 to the base electrode 40 of the transistor 33, and the terminal 44 is connected to ground. Thus, the input signal appears across resistor 42. An amplified and varying direct current modulation signal then appears across resistor 35. The collector electrode 34 is connected to the junction 29 of the two diodes 23 and 24 through a radio-frequency choke 46 which isolates the radio-frequency energy from the modulator circuit. The end of the choke 46 connected to the collector electrode 34 is by-passed to ground by a capacitor 47.

In the exemplary embodiment of the invention described, the following values for the circuit components have been found to be satisfactory:

| | | |
|---|---|---|
| Capacitors 8 and 31 | mmfd | 3–30 |
| Capacitor 47 | mfd | .001 |
| Capacitors 15 and 16 | mmfd | 10 |
| Capacitors 19 and 21 | mfd | .01 |
| Capacitors 38 and 45 | mfd | 10 |
| Resistor 20 | ohms | 100 |
| Resistor 42 | do | 10K |
| Resistor 41 | do | 33K |
| Resistors 12 and 13 | do | 100K |
| Resistors 35 and 37 | do | 2K |
| Battery 22 | volts | 30 |
| Choke 46 | mh | 1 |

With the above values, plus or minus 50 kilocycles frequency deviation was obtained at 99 megacycles, the third harmonic of the 33 megacycle oscillator frequency, and 50 milliwatts of power was developed at the output circuit with .05 volt modulating signal at the base electrode 40 of the modulator transistor 33.

Thus, there has been described a frequency modulation circuit utilizing solid-state devices which circuit is simple, efficient and inexpensive for developing a linear signal having a large frequency deviation and substantially no amplitude modulation.

What is claimed is:

1. In combination: first and second transistors, each having an input terminal, an output terminal and a reference terminal; an inductor having one end coupled to the output terminal of said first transistor and having its other end coupled to the output terminal of said second transistor, the input terminals of said first and second transistors being coupled to a center-tap on said inductor, the input terminal of said first transistor being coupled to the output terminal of said second transistor, the input terminal of said second transistor being coupled to the output terminal of said first transistor, the reference terminals of said first and second transistor being connected to a point of fixed potential; a tuning capacitor coupled to said inductor for defining a circuit tuned to a predetermined frequency; a pair of unilaterally conductive semiconductor devices connected in series opposition across said inductor; a source of varying direct current signal coupled to the connection between said devices and having a polarity such as to cause the devices to be non-conductive; a resonant circuit coupled to said inductor; and a utilization circuit coupled to said resonant circuit.

2. A circuit for modulating the frequency of a wave comprising first and second PNP transistors, each having a base, an emitter, and a collector; an inductor having one end coupled to the collector of said first transistor and having the other end coupled to the collector of said second transistor, the bases of said transistors being coupled to a center-tap on said inductor, the base of said first transistor being coupled to the collector of said second transistor, the base of said second transistor being coupled to the collector of said first transistor, the emitters of said transistors being coupled to a point of fixed potential thereby defining a symmetrical oscillator circuit for developing a carrier wave having high third harmonic content; a tuning capacitor coupled to said inductor for defining therewith a circuit tuned to a predetermined frequency; a pair of unilaterally conductive semiconductor devices connected in series opposition across said inductor for varying the frequency of said carrier wave from said predetermined frequency in response to a direct current; a source of a varying direct current coupled to the junction of said devices and having a polarity such as to cause the devices to be non-conductive; a resonant circuit coupled to said inductor and tuned to the third harmonic of said predetermined frequency; and a utilization circuit coupled to said resonant circuit.

3. In combination: first and second PNP transistors, each having a base, an emitter, and a collector; an inductor having one end connected to the collector of said first transistor and having the other end connected to the collector of said second transistor; a pair of base resistors each individually connected from the bases of said first and second transistors to a center-tap on said inductor; a first by-pass capacitor connected from said center-tap to a point of fixed potential; a source of operating potential with respect to the point of fixed potential connected to said center-tap; first and second coupling capacitors, one coupling the base of said first transistor to the collector of said second transistor, the other coupling the base of said second transistor to the collector of said first transistor; a common emitter resistor having one end connected to the emitters of said first and second transistors and having the other end connected to the point of fixed potential; a second by-pass capacitor connected in parallel with said common emitter resistor; a split-stator capacitor having the stators individually connected to individual ends of said inductor, the rotor of said split-stator capacitor being connected to the point of fixed potential, said split-stator capacitor and said inductor together defining a tuned circuit tuned to a predetermined frequency; a pair of unilaterally conductive semiconductor devices connected in series opposition across said inductor; a radio-frequency choke having one end connected to the junction of said devices; a third by-pass capacitor connected from the other end of said choke to the point of fixed potential, a source of a varying direct current signal coupled to the junction of said devices and having a polarity such as to cause the devices to be non-conductive; a resonant circuit coupled to said inductor and tuned to the third harmonic of said predetermined frequency; and a utilization circuit coupled to said resonant circuit.

4. In combination: first, second and third PNP transistors, each having a base, an emitter, and a collector; an inductor having one end connected to the collector of said first transistor and having the other end connected to the collector of said second transistor; a pair of base resistors each individually connected from the bases of said first and second transistors to a center-tap on said inductor; a first by-pass capacitor connected from said center-tap to a point of fixed potential; a source of operating potential with respect to the point of fixed potential connected to said center-tap; first and second coupling capacitors, one being connected from the base of said first transistor to the collector of said second transistor, the other being connected from the base of said second transistor to the collector of said first transistor; a common emitter resistor having one end connected to the emitters of said first and second transistors and having the other end connected to the point of fixed potential; a second by-pass capacitor connected in parallel with said common emitter resistor; a split-stator capacitor having the stators individually connected to individual ends of said inductor, the rotor of said split-stator capacitor being connected to the point of fixed potential, said split-stator capacitor and said inductor together defining a tuned circuit tuned to a predetermined frequency; a pair of unilaterally conductive semiconductor devices connected in series opposition across said inductor; a radio-frequency choke having one end connected to the junction of said devices; a third by-pass capacitor connected from the other end of said choke to the point of fixed potential, the junction of said third by-pass capacitor and said choke being connected to the collector of said third transistor; a first resistor connected from the collector of said third transistor to said source of operating potential; a second resistor connected from the emitter of said third transistor to the point of fixed potential; a fourth by-pass capacitor connected in parallel with said second resistor; a third resistor connected from the base of said third transistor to the point of fixed potential; a fourth resistor connected from the base of said third transistor to said source of operating potential; a third coupling capacitor having one end connected to the base of said third transistor; a signal source connected from the other side of said third coupling capacitor to the point of fixed potential; a resonant circuit coupled to said inductor and tuned to the third harmonic of said predetermined frequency; and a utilization circuit coupled to said resonant circuit.

References Cited in the file of this patent

UNITED STATES PATENTS

| | | |
|---|---|---|
| 2,182,377 | Guanella | Dec. 3, 1939 |
| 2,282,103 | Tunick | May 5, 1942 |
| 2,407,424 | Hollingsworth | Sept. 10, 1946 |
| 2,427,204 | Ferguson | Sept. 9, 1947 |
| 2,530,937 | Boykin | Nov. 21, 1950 |
| 2,708,739 | Bucher | May 17, 1955 |
| 2,788,493 | Zawels | Apr. 9, 1957 |
| 2,915,631 | Nilssen | Dec. 1, 1959 |